United States Patent
Ke et al.

(10) Patent No.: US 7,737,532 B2
(45) Date of Patent: Jun. 15, 2010

(54) HYBRID SCHOTTKY SOURCE-DRAIN CMOS FOR HIGH MOBILITY AND LOW BARRIER

(75) Inventors: Chung-Hu Ke, Taipei (TW); Chih-Hsin Ko, Fongshan (TW); Hung-Wei Chen, Hsinchu (TW); Wen-Chin Lee, Hsin-Chu (TW); Min-Hwa Chi, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 654 days.

(21) Appl. No.: 11/220,176

(22) Filed: Sep. 6, 2005

(65) Prior Publication Data

US 2007/0052027 A1 Mar. 8, 2007

(51) Int. Cl.
H01L 29/04 (2006.01)
(52) U.S. Cl. .............................. 257/627; 257/E33.003; 438/168
(58) Field of Classification Search .............. 257/255, 257/627, 628, E33.003; 438/168
See application file for complete search history.

(56) References Cited

U.S. PATENT DOCUMENTS

| 4,857,986 | A | 8/1989 | Kinugawa | |
|---|---|---|---|---|
| 5,384,473 | A | 1/1995 | Yoshikawa et al. | |
| 6,096,590 | A | * | 8/2000 | Chan et al. ............. 438/233 |
| 6,261,932 | B1 | 7/2001 | Hulfachor | |
| 6,744,103 | B2 | 6/2004 | Snyder | |
| 6,784,035 | B2 | 8/2004 | Snyder et al. | |
| 6,911,383 | B2 | * | 6/2005 | Doris et al. ............. 438/588 |
| 7,235,433 | B2 | * | 6/2007 | Waite et al. ............. 438/149 |
| 7,298,009 | B2 | * | 11/2007 | Yan et al. ............. 257/357 |
| 2004/0041226 | A1 | 3/2004 | Snyder et al. | |
| 2004/0113171 | A1 | 6/2004 | Chiu et al. | |
| 2004/0266076 | A1 | 12/2004 | Doris et al. | |
| 2005/0003595 | A1 | 1/2005 | Snyder et al. | |

OTHER PUBLICATIONS

Connelly, D., et al., "A New Route to Zero-Barrier Metal Source/Drain MOSFETs," IEEE Transactions on Nanotechnology, Mar. 2004, pp. 98-104, vol. 3, No. 1.
Connelly, D., at al., "Optimizing Schottky S/D Offset for 25-nm Dual-Gate CMOS Performance," IEEE Electron Device Letters, Jun. 2003, pp. 411-413, vol. 24, No. 6.
Connelly, D. et al., "Performance Advantage of Schottky Source/Drain in Ultrathin-Body Silicon-on-Insulator and Dual-Gate CMOS," IEEE Transactions in Electron Devices, May 2003, pp. 1340-1345, vol. 50, No. 5.
Doris, B., et al., "A Simplified Hybrid Orientation Technology (SHOT) for High Performance CMOS," Symposium on VLSI Technology Digest of Technical Papers, IEEE, 2004, pp. 86-87.

(Continued)

Primary Examiner—Thao X Le
Assistant Examiner—Ajay K Arora
(74) Attorney, Agent, or Firm—Slater & Matsil, L.L.P.

(57) ABSTRACT

A CMOS device is provided. A semiconductor device comprises a substrate, the substrate having a first region and a second region, the first region having a first crystal orientation represented by a family of Miller indices comprising $\{i,j,k\}$, the second region having a second crystal orientation represented a family of Miller indices comprising $\{l,m,n\}$, wherein $l^2+m^2+n^2 > i^2+j^2+k^2$. Alternative embodiments further comprise an NMOSFET formed on the first region, and a PMOSFET formed on the second region. Embodiments further comprise a Schottky contact formed with at least one of a the NMOSFET or PMOSFET.

20 Claims, 9 Drawing Sheets

OTHER PUBLICATIONS

Hwang, J. R., et al., "Symmetrical 45nm PMOS on (110) Substrate with Excellent S/D Extension Distribution and Mobility Enhancement," Symposium on VLSI Technology Digest of Technical Papers, IEEE, 2004, pp. 90-91.

Kedzierski, J., et al., "Complementary silicide source/drain thin-body MOSFETs for the 20nm gate length regime," IEDM, 2000, pp. 57-60.

Kinoshita, a., et al., "Solution for High-Performance Schottky-Source/Drain MOSFETs: Schottky Barrier Height Engineering with Dopant Segregation Technique," Symposium on VLSI Technology Digest of Technical Papers, IEEE, 2004, pp. 168-169.

Lin, H.-C., et al., "High-Performance P-Channel Schottky-Barrier SOI FinFET Featuring Self-Aligned PtSi Source/Drain and Electrical Junctions," IEEE Electron Device Letters, Feb. 2003, pp. 102-104, vol. 24, No. 2.

Sullivan, J. P. et al., "Correlation of the interfacial structure and electrical properties of epitaxial silicides on Si," J. Vac. Sci. Technol., American Vacuum Society, Jul./Aug. 1992, pp. 1959-1964, vol. A 10, No. 4.

Tung, R. T., et al., "Expitaxial metal-semiconductor structures and their properties," J. Vac. Sci. Technol., American Vacuum Society, Nov./Dec. 1986, pp. 1435-1443, vol. B 4, No. 6.

Tung, R. T., et al., "Schottky-barrier heights of single-crystal $NiSi_2$ on Si(111): The effect of a surface *p-n* junction," Physical Review, The American Physical Society, May 15, 1986, pp. 7077-7090, vol. 33, No. 10.

Tung, R. T., et al., "Schottky-Barrier Inhomogeneity at Epitaxial $NiSi_2$ Interfaces on Si(100)," Physical Review Letters, Jan. 7, 1991, pp. 72-75, vol. 66, No. 1.

Werner, P., et al., "Interface structure and Schottky barrier height of buried $CoSi_2$/Si(001) layers," J. Appl. Phys., American Institute of Physics, Sep. 15, 1993, pp. 3846-3854, vol. 74, No. 6.

Yang, F.-L., et al., "5nm-Gate Nanowire FinFET," Symposium on VLSI Technology Digest of Technical Papers, IEEE, 2004, pp. 196-197.

Yang, M., et al., "On the Integration of CMOS and Hybrid Crystal Orientations," Symposium on VLSI Technology Digest of Technical Papers, IEEE, 2004, pp. 160-161.

Liu, C.W., et al., "Mobility-Enhancement Technologies," IEEE Circuits & Devices Magazine, May/Jun. 2005, pp. 21-36.

Michaelson, H.B., "The work function of the elements and its periodicity," Journal of Applied Physics, vol. 48, No. 11, Nov. 1977, pp. 4729-4733.

* cited by examiner

HYBRID SCHOTTKY SOURCE-DRAIN CMOS FOR HIGH MOBILITY AND LOW BARRIER

TECHNICAL FIELD

This invention relates generally to semiconductor fabrication and more particularly to a fabrication method for a complimentary metal oxide semiconductor (CMOS) device having metal-semiconductor, source/drain junctions.

BACKGROUND

A common electrical contact used in modem devices is the metal-semiconductor contact. Depending on the materials, the contact may be ohmic or rectifying. An ohmic contact has low electrical resistance, regardless of the direction of current flow. A rectifying contact behaves as a diode in that it conducts current freely in one direction but has a barrier to current flow in another. This so-called Schottky barrier is the potential necessary for an electron to pass from the metal to the semiconductor, and it is an important parameter in determining the electrical properties of the metal-semiconductor contact.

Recently, advanced semiconductor devices use a metal-semiconductor, Schottky contact to form the source and/or drain of a MOSFET. The Schottky source/drain (S/D) MOSFET has numerous benefits for achieving many device scaling goals for the 45 nm node and beyond. The metal/silicide structure of the S/D has lower resistance, and it is atomically abrupt. This leads to faster device speed and a scalability advantage over conventional impurity doped S/D technologies. The metal silicide S/D forms a Schottky barrier to the channel, which leads to reduced $I_{off}$ leakage. Schottky S/D technology reduces the required dopants in the channel region, thereby leading to higher channel mobility. Furthermore, the Schottky S/D process may include current state-of-the-art CMOS technology, including CMOS on SOI, strained Si techniques, metal gate and high-k gate dielectrics, SiGe strain techniques, as well as other semiconductor fabrication technologies.

Despite these clear advantages, there are many challenges facing the integration of Schottky S/D technology with current manufacturing methods. For example, a large Schottky barrier at a source electrode can significantly degrade the drive current of a Schottky CMOS. In order to solve this problem, source junctions with a Schottky barrier lower than about 0.2 eV are required. Several new S/D materials, such as $ErSi_2$ for NMOS and PtSi for PMOS, have been investigated. However, such material integration has not always been successful. New materials require re-optimization of existing fabrication steps such as metal deposition, silicidation, and etching before Schottky S/D methods can reach mass production.

In light of these and other problems, there remains a need for improving Schottky S/D manufacturing methods. The electrical properties of the metal-semiconductor need to be controlled, but new methods should not cause excessive integration problems with other fabrication methods. One way forward is to develop new Schottky S/D methods that use existing materials, thereby minimizing the integration issues that have hampered conventional methods.

SUMMARY OF THE INVENTION

These and other problems are generally solved or circumvented, and technical advantages are generally achieved, by preferred embodiments of the present invention in which a Schottky S/D CMOS uses a hybrid substrate for lowering NMOS and PMOS Schottky barriers.

In preferred embodiments of the present invention, a semiconductor device is provided. A semiconductor device comprises a substrate, the substrate having a first region and a second region, the first region having a first crystal orientation represented by a family of Miller indices comprising $\{i,j,k\}$, the second region having a second crystal orientation represented by a family of Miller indices comprising $\{l,m,n\}$. In preferred embodiments of the invention $l^2+m^2+n^2>i^2+j^2+k^2$. Alternative embodiments further comprise an NMOSFET formed on the first region, and a PMOSFET formed on the second region. Embodiments further comprise a Schottky contact formed with at least one of the NMOSFET or PMOSFET.

Alternative embodiments further include a CMOS device. The CMOS device comprises a substrate, the substrate having a first region and a second region, the first region having a first crystal orientation, the second region having a second crystal orientation, wherein the first crystal orientation is different from the second crystal orientation. Alternative embodiments comprise an NMOSFET formed on the first region, the NMOSFET comprising an NMOS source electrode, an NMOS drain electrode, and a Schottky contact formed with at least one of the NMOS source electrode and the NMOS drain electrode; and a PMOSFET formed on the second region; the PMOSFET comprising a PMOS source electrode, a PMOS drain electrode, and a Schottky contact formed with at least one of the PMOS source electrode and the PMOS drain electrode.

Still other embodiments comprise a p-type semiconductor device. Embodiments comprise a substrate, a PMOS source on the substrate, and a PMOS drain on the substrate. Preferably, at least one of the PMOS source electrode and the PMOS drain electrode comprises a Schottky contact, wherein the PMOS source and the PMOS drain define a channel there between. Preferably, the channel orientation is represented by a family of Miller indices comprising $<i,j,k>$, wherein $i^2+j^2+k^2>1$ (or $l^2+m^2+n^2 \geq 2$).

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1A:
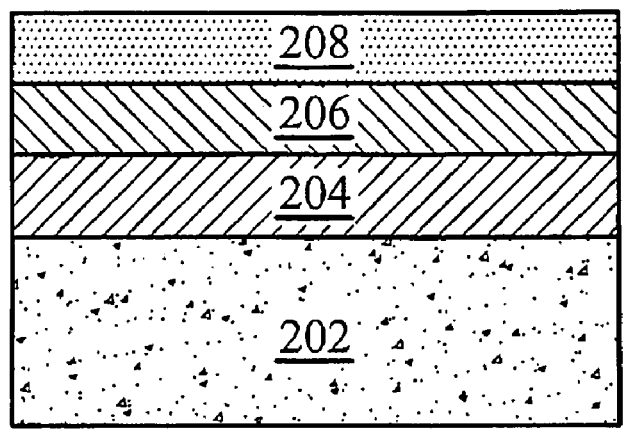
FIGS. 1a-1h are cross sectional views of embodiments for fabricating a CMOS on a hybrid substrate having multiple crystal orientations.

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

When a metal contacts a semiconductor, a barrier forms at the metal-semiconductor interface. The barrier (or barrier height) depends on the work function difference between the metal and the semiconductor, the interface state density, and the doping level in the semiconductor. In the absence of surface states, the barrier height is mainly determined by the work function difference between the metal and the semiconductor. If there is a large density of surface states, the barrier height is determined by the semiconductor surface, and it is independent of the metal work function. If a large density of surface states are present on the semiconductor surface, then the Fermi level is pinned by the surface states and the barrier height is between these extremes. Preferably, the barrier height for electrons or holes is no greater than about 0.4 eV.

The surface state density is highly dependent on the surface crystallographic orientation. In silicon, the surface state density of the {100} orientation is about one order of magnitude smaller (i.e., ≈10× smaller) than the {111} orientation. One factor known to influence the surface state density is the number of bonds per unit area on the silicon surface.

The present invention will be described with respect to preferred embodiments in a specific context, namely CMOS fabrication on hybrid substrates, wherein the substrate orientation allows for low Schottky barrier for both NMOS and PMOS. For convenience, the structure comprising a metal bonded to a semiconductor is referred to herein as Schottky contract, although Schottky diode, or Schottky barrier junction are commonly used in the art. As used herein, the so-called Schottky barrier refers to the metal/semiconductor interface.

Generally, a primary building block in ULSI circuits is a CMOS logic gate, comprising at least one NFET and at least one PFET. A silicon-on-insulator substrate may be used to implement a CMOS logic gate with different crystal orientations for the PFET and the NFET to provide optimum hole and electron mobility. Devices may be either planar or multiple gate devices such as trigate, or FinFET. One advantage of a preferred embodiment is that the real estate of the logic gate may be reduced when carrier mobility is increased. Accordingly, significant real estate on the entire semiconductor chip may be saved by optimizing the crystal orientations to improve carrier mobility. In addition, the manufacturing cost may be effectively reduced. Another advantage of a preferred embodiment is that the floating body effect is alleviated.

With reference now to FIGS. 1a-1h, there are illustrations of the manufacturing sequence according to preferred embodiments of the present invention. FIGS. 1a-1h show a cross sectional view of a standard silicon on insulator (SOI) structure that has been wafer bonded to a silicon substrate in accordance with prior art methods cited herein. The SOI structure includes a silicon layer between about 2 to 200 nm thick, preferably about 40 nm thick. In accordance with preferred embodiments of this invention, FIG. 1a comprises a silicon substrate 202 having a selected first surface orientation and a doping level. Overlaying the substrate is a buried dielectric (oxide) layer, BOX, 204. BOX 204 may have a thickness between about 10 to 200 nm, preferably about 50 nm. Overlaying the BOX 204 is an SOI silicon substrate 206 having a selected second surface orientation and a doping level. Finally, overlaying the SOI silicon substrate 206 is a nitride, hard mask layer 208. Alternative embodiments not illustrated include bulk substrates such as Ge, SiC, GaAs, GaAlAs, InP, GaN SiGe, and SiGe graded buffer. Hybrid substrates may include a portion having an orientation such as {100} and {110}. Further, BOX 204 may comprise a dielectric other than oxide, such silicon nitride, for example.

Figure 1B:
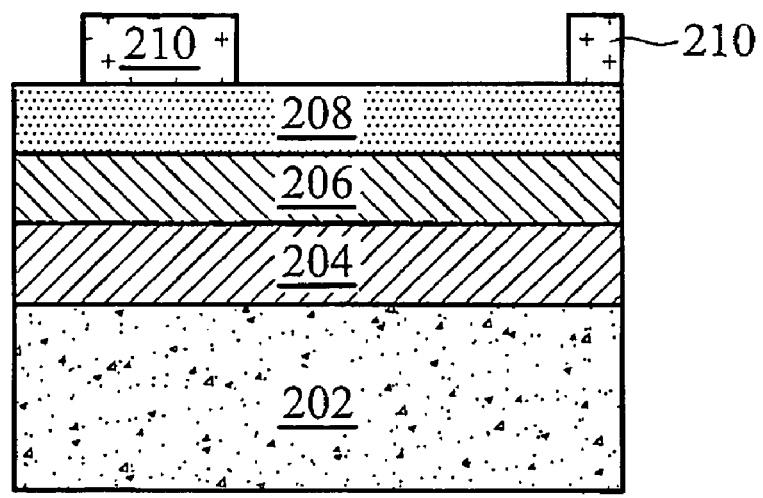
Figure 1C:
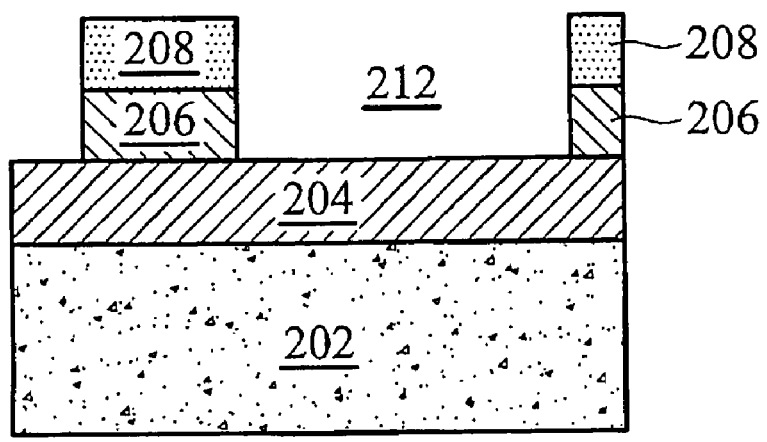
Figure 1D:
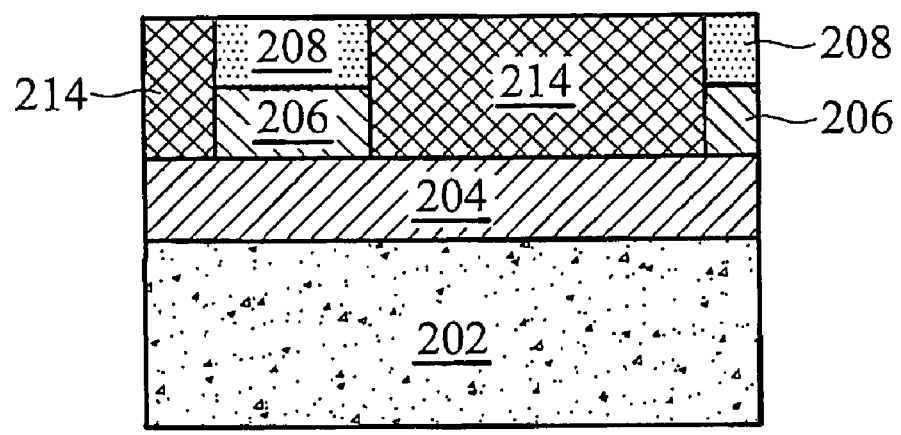

Next, in FIG. 1b, a layer of photoresist 210 is applied, patterned, and developed. Openings 212 are made through the hard mask layer 208 and second silicon substrate 206 layers to the openings 212, FIG. 1c. The openings 212 are then filled with a suitable isolation insulator 214 such as $SiO_2$ for isolating electrically active regions, thereby avoiding shorting contacts, FIG. 2d.

Figure 1E:
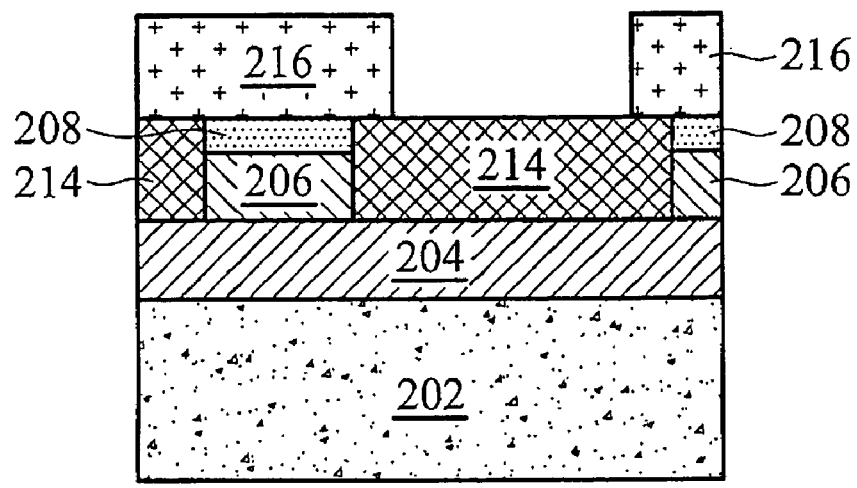
Figure 1F:
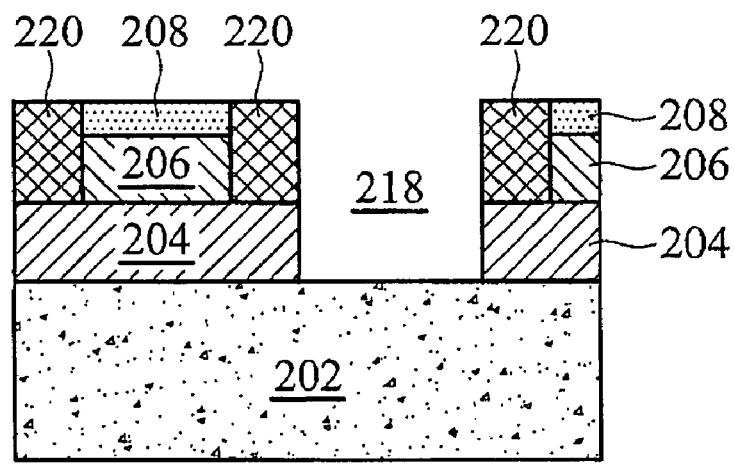

Next, in FIG. 1e, there is an application of a second photoresist layer 216. The second photoresist layer 216 is patterned and etched, FIG. 1f, and an opening 218 made through selected portions of the isolation insulators 214. Portions of the isolation insulator 214 remaining after the step in FIG. 2f function as shallow trench isolation, STI, regions 220 in the finished device.

Figure 1G:
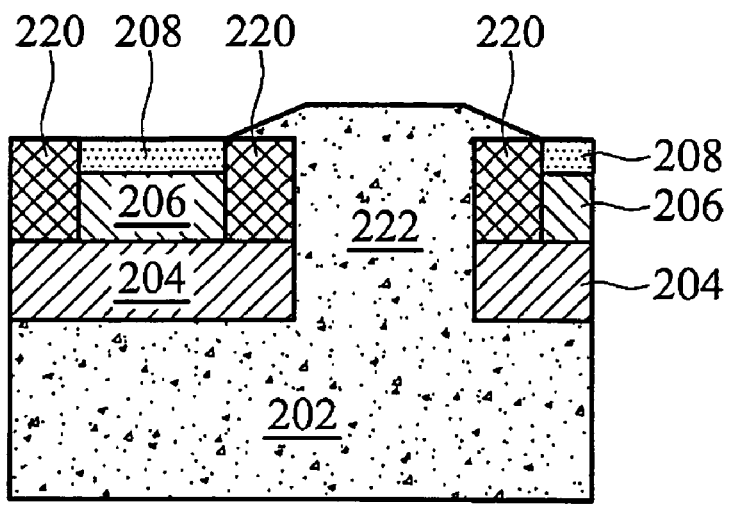
Figure 1H:
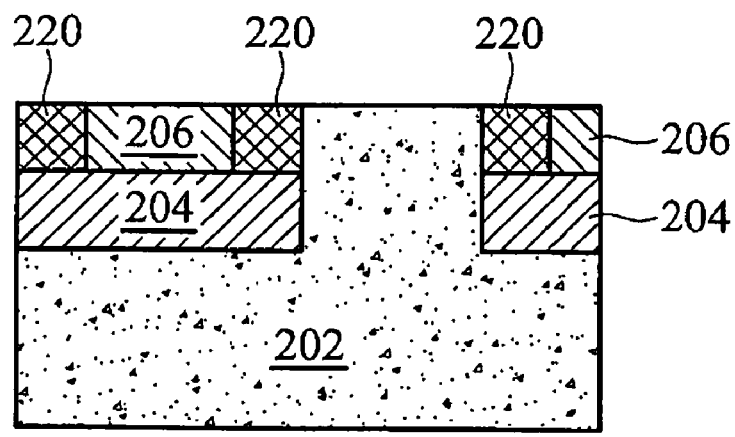

Next, in FIG. 1g, an epitaxial layer 222 of silicon is grown on the silicon substrate 202. The crystal orientation of epitaxial layer 222 is the same as the substrate 202. Next, the multi-layer structure shown in FIG. 1g is planarized, thereby forming a substrate having multiple crystal orientations that is suitable for device fabrication.

In describing various embodiments, it is useful to use terminology and nomenclature commonly used in the crystallographic arts. For example, the well-known Miller indices are used herein to describe crystallographic planes and directions. Since preferred embodiments disclosed herein include silicon, one skilled in the art recognizes that the Miller indices refer to a face-centered cubic crystallographic structure. In keeping with crystallographic nomenclature, [xyz] and (xyz) describe specific directions and planes respectively, and <xyz> and {xyz} describe a general type, or family, of directions and planes respectively. For example, [−1,0,1], [0,1,1], [1,−1,0], and [1,0,1] are specific directions of the <110> direction family. One skilled the art also recognizes that it is sometimes useful to illustrate an embodiment with reference to specific Miller indices. However, unless otherwise clear from the context, reference to specific directions and planes is for exemplary convenience and clarity only. It is not intended to limit an embodiment to a single crystal orientation or a single direction when reference to other members of a similarly situated type would have been equally appropriate.

Figure 2:
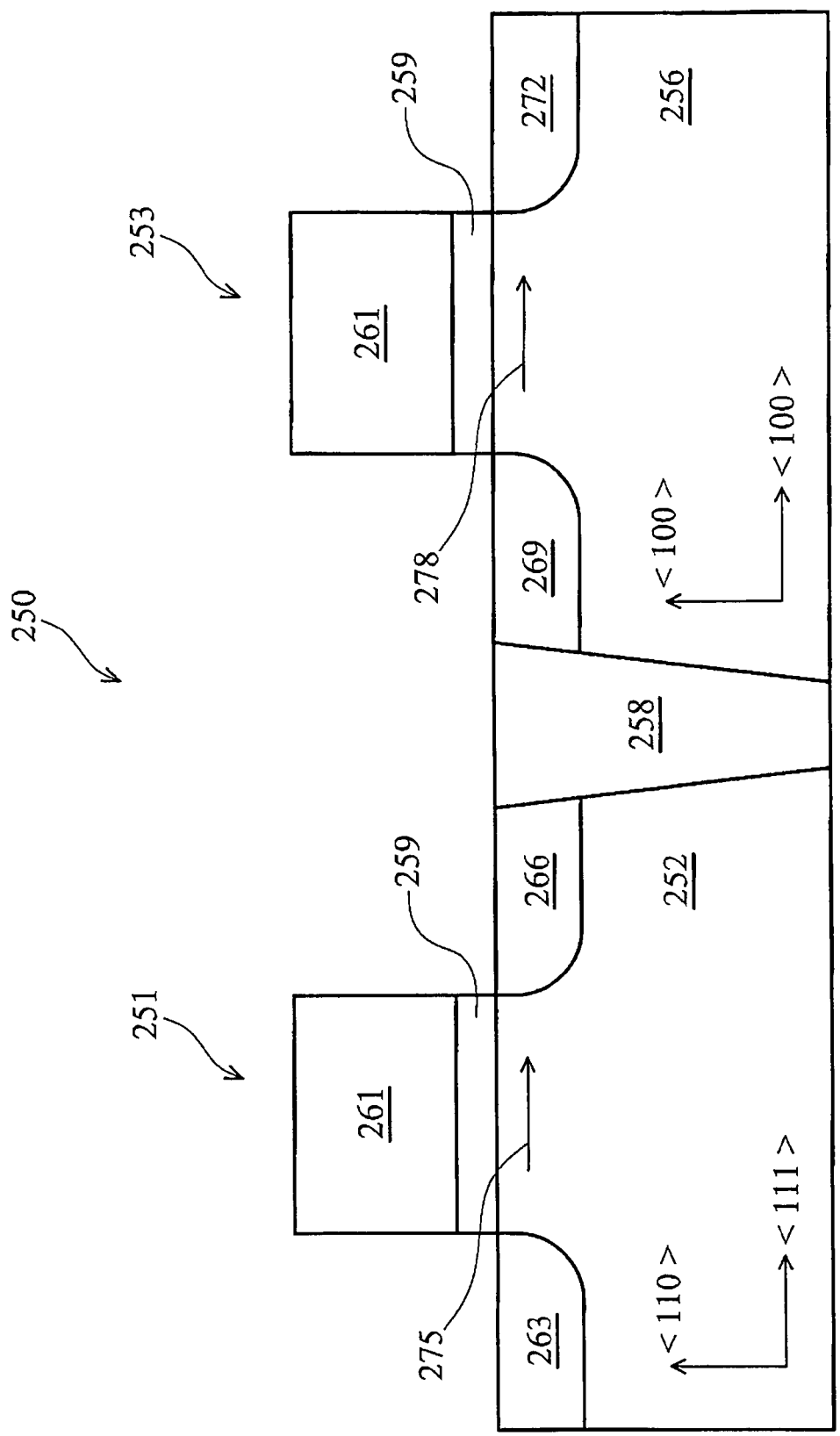
FIG. 2 is a cross sectional view of embodiments illustrating a CMOS layout.

Turning now to FIG. 2, there is illustrated a CMOS device 250 formed according to preferred embodiments. The CMOS device comprises a PMOSFET 251 on a PMOSFET hybrid substrate 252, and an NMOSFET 253 on an NMOSFET hybrid substrate 256. Different hybrid regions are isolated, such as by STI 258. Included in the CMOS device 250 is a gate dielectric 259 and a gate electrode 261.

Suitable gate dielectrics 259 include poly-Si or fully Ni-silicided poly-Si, metal oxides such as $Al_2O_3$, $ZrO_2$, $HfO_2$, $Y_2O_3$, $La_2O_3$, $TiO_2$, $Ta_2O_5$; silicates such as, $ZrSiO_4$, ZrSiN, $HfSiO_4$, HfSiON, HfSiN; oxides such as $SiO_2$ and silicon oxynitride.

Suitable gate electrode 261 materials include metal gates comprising Mo, Ru, Ti, Ta, W, or Hf; metal nitride stacked gates; metal oxide gates such as $RuO_2$ or $IrO_2$; metal nitride gates such as MoN, WN, TiN, TaN, TaAlN, TaSiN; poly silicon; or poly SiGe gates. Alternative embodiments may also include gate silicide such as $CoSi_2$ or NiSi.

Continuing with FIG. 2, in preferred embodiments the PMOSFET 251 includes a source 263 and a drain 266, wherein the source 263 and the drain 266 comprise a Schottky contract. Likewise, NMOSFET 253 includes a source 269 and a drain 272, wherein the source 269 and the drain 272 comprise a Schottky contract. In alternative embodiments, not illustrated, only the PMOSFET or only the NMOSFET may include a Schottky contact. In still other embodiments, not illustrated, only the source or only the drain may include a Schottky contact. For convenience, the term Schottky S/D is used to refer to a drain comprising a Schottky contact or a source comprising a Schottky contract, or a combination thereof.

Preferably, the PMOSFET hybrid substrate 252 has a {110} orientation and the NMOSFET hybrid substrate 256 has a {100} orientation. Forming a Schottky S/D PMOSFET on a {110} silicon substrate is particularly preferred because this orientation minimizes the Schottky barrier for holes. Likewise, forming a Schottky S/D NMOSFET on a {100} silicon substrate is particularly preferred because this orientation minimizes the Schottky barrier for electrons. The S/D is formed by depositing a metal or a metal silicide, preferably by using a single metal to lower the barrier height for N and P devices.

The Schottky contact formed with the substrate may comprise a refractory metal silicide such as ErSi, CoSi, NiSi, TiSi, WSi, PtSi; a refractory metal such as Mo, Ru, Ti, Ta, W, Hf; an n-type dopant (e.g., Li, Sb, P, As), a p-type dopant (e.g., B, Al, Ga, In), and combinations thereof. These materials preferably have a work function greater than about 4 eV, and have a Schottky barrier height less than about 0.4 eV when these materials are formed as a Schottky contact (or Schottky-like contact). The Schottky contact is preferably less than about 500 Angstroms thick.

With consideration of the interfacial parameters described above, which influence surface states, alternative embodiments of the invention comprise an NMOSFET formed on a substrate having a crystal orientation represented by a family of Miller indices comprising {i,j,k}, and a PMOSFET formed on a substrate having a second crystal orientation represented a family of Miller indices comprising {l,m,n}, wherein $l^2+m^2+n^2>i^2+j^2+k^2$. As noted above, a particularly preferred embodiment comprises an NMOSFET formed on a {110} substrate and a PMOSFET formed on a {100} substrate. Alternative embodiments comprise an NMOSFET formed on a {110} or a {100} substrate and a PMOSFET formed on a {111}, {211}, or {311} substrate.

Still continuing with FIG. 2, and in further accordance with preferred embodiments, a PMOSFET channel 275 and an NMOSFET channel 278 are oriented along selected crystallographic directions. In conventional CMOS technology, devices generally are made on one specific semiconductor substrate with a single crystal orientation. However, in silicon, electrons have their greatest mobility in the {100} family of planes, while holes have their greatest mobility in the {110}-plane family. Generally, one or the other of a PFET or an NFET is implemented with the optimum crystal orientation, while the other functions with less than optimal carrier mobility because it is implemented with the same crystal orientation. U.S. Pat. No. 4,857,986 to Kinugawa, which is hereby incorporated herein by reference, describes some of the effects of crystal orientation on carrier mobility. Workers have recognized these problems and have developed techniques for fabricating CMOS devices on hybrid substrates with multiple crystal orientations. For example, U.S. Pat. No. 5,384,473 to Yoshikawa et al., which is hereby incorporated herein by reference, describes a method for fabricating PFETs on (110) surfaces and NFETs on (100) surfaces through wafer bonding and selective epitaxy.

In light of these considerations, the PMOSFET 251 and the NMOSFET 253 are preferably on a hybrid substrate orientation wherein the respective carrier concentration is maximum. Such a configuration is particularly preferred because it both maximizes carrier mobility and minimizes Schottky barrier height (as described above with respect to embodiments). In further accordance with preferred embodiments, the NMOSFET channel 278 is oriented along the <100>, the direction where electron mobility is maximum for the {100} orientation.

In a less preferred embodiment (not illustrated), the PMOSFET channel 275 is oriented along the <110> direction, which is the direction where hole mobility is maximum for the {110} orientation. The reason the {110}<110> configuration is less preferred is due to symmetry considerations involving the {110} substrate. In this orientation, there are only two <110> directions lying parallel to the face of the substrate. Therefore, the {110}<110> configuration reduces device layout options for the PMOSFET in hybrid substrate manufacturing. The more preferred PMOSFET 251 layout is illustrated in FIG. 2.

As shown in FIG. 2, the PMOSFET channel 275 is aligned along the <111> direction. While hole mobility is only approximately 70% its maximum value in the {110}<111> substrate/channel configuration, there are four <111> directions lying in the {110} plane versus only two <110> directions in this plane. This, therefore, doubles PMOSFET device layout options in exchange for only a 30% mobility reduction. Accordingly, in light of these considerations as well as those above with respect to Schottky barrier height, the more preferred PMOSFET 251 orientation is illustrated in FIG. 2.

In addition to the embodiments described above, alternative embodiments of the invention provide manufacturing methods for advanced planar devices and advanced multiple-gate devices. One such alternative embodiment is illustrated in FIG. 3.

Figure 3:
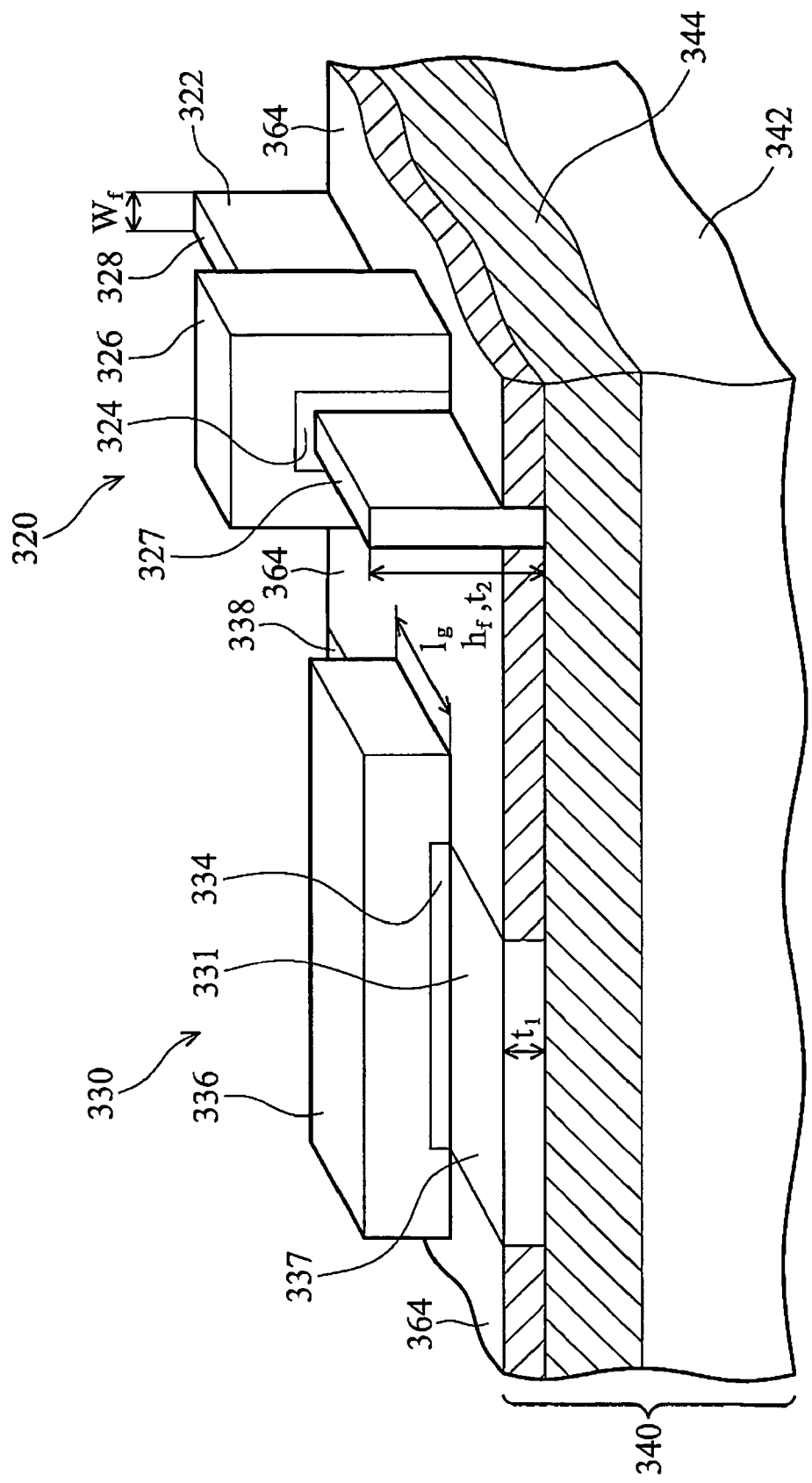
FIG. 3 is a perspective view showing part of an SOI chip having a planar transistor and a multiple gate transistor formed in accordance with an embodiment of the process invention.

FIG. 3 is a perspective view for a portion of a semiconductor structure incorporating a first embodiment of the present invention. In FIG. 3, a planar transistor 330, such as a UTB-SOIFET, and a multiple-gate transistor 320, such as a FinFET, are shown formed on a semiconductor-on-insulator (SOI) substrate structure 340. The SOI substrate structure 340 comprises a substrate 342, an insulator layer 344, and a semiconductor layer 364. The planar transistor 330 has a first active region 331 with a generally thin, planar shape. The multiple-gate transistor 320 has a second active region 322 with a generally tall, fin shape. The first and second active regions 331, 322 are formed from a same semiconductor layer of the SOI structure 340. The first active region 331 has a first thickness $t_1$. The second active region 322 has a second thickness $t_2$. The second thickness $t_2$ is larger than the first thickness $t_1$.

The first thickness $t_1$ is preferably less than about 400 angstroms, and even more preferably less than about 200 angstroms. The first thickness $t_1$ may be less than half of the gate length $l_g$ for the planar transistor 330, and more preferably the first thickness $t_1$ is less than one third of the gate length $l_g$. For example, if the gate length $l_g$ of the planar transistor 330 is 300 angstroms (30 nm), the first thickness $t_1$ may be less than 150 angstroms or more preferably less than 100 angstroms. When the first thickness $t_1$ is less than half or one third of the gate length $l_g$, the planar transistor 330 may be referred to as an ultra-thin body (UTB) transistor. A first gate dielectric 334 is overlying a first channel region in the first active region 331. A first gate electrode 336 is overlying the first gate dielectric 334. Source and drain regions 337, 338 of the planar transistor 330 are formed in the first active region 331 oppositely adjacent the first gate electrode 336.

Still referring to FIG. 3, the second thickness $t_2$ (i.e., $h_f$) for the fin structure of the second active region 322 is preferably greater than about 100 angstroms, and more preferably greater than about 400 angstroms, for example. The fin width $w_f$ is preferably greater than about 500 angstroms. A second gate dielectric 324 is overlying a second channel region in the second active region 322. The second gate dielectric 324 at least partially wraps around the second channel region of the fin. A second gate electrode 326 is overlying the second gate dielectric 324. The second gate dielectric 324 electrically insulates the second gate electrode 326 from the fin of the second active region 322. The multiple-gate transistor 320 shown in FIG. 3 is a triple-gate transistor because the second gate electrode 326 extends along three sides (along at least part of the two sidewalls and along the top surface of the fin) of the second channel region of the fin. Source and drain regions 327, 328 of the multiple-gate transistor 320 are formed in the second active region 322 oppositely adjacent the second gate electrode 326. Because a substantial fraction of the drive current flowing from the source 327 to the drain 328 flows on the sidewall surfaces, it is often advantageous to have a tall fin (see e.g., example dimensions described above) for the multiple-gate transistor 320.

Although not shown, the planar transistor 330 and/or the multiple-gate transistor 320 of FIG. 3 may also have spacers formed on the sidewalls of the gate electrodes 326, 336. Such spacers may be useful in doping the source and drain regions 327, 328, 337, 338, for example. Also, the planar transistor 330 and/or the multiple-gate transistor 320 of an embodiment may have elevated source and drain regions, or raised source and drain regions (not shown). The source and drain regions may also be strapped with a conductive material such as a silicide. In such case, the spacers prevent conductive silicide material on the source and drain regions from making electrical contact with the gate electrode, which would lead to undesirable shorting of the source or drain regions to the gate electrode.

Figure 4:
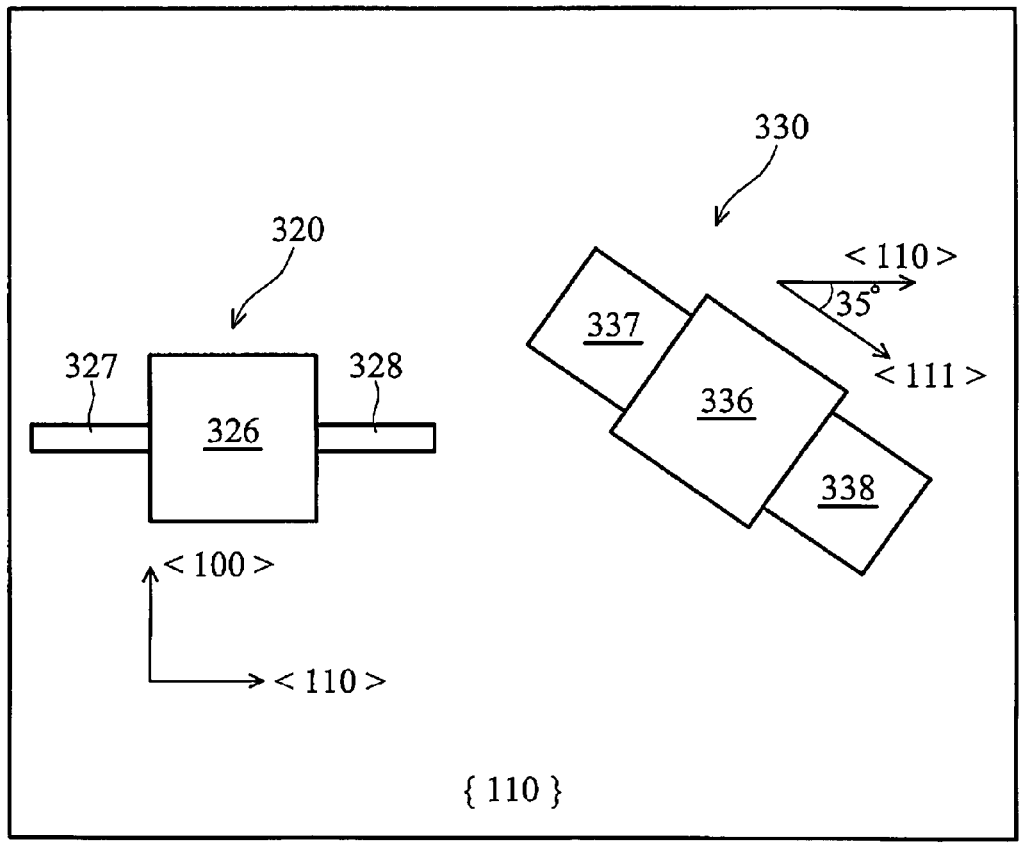
FIG. 4 is a plan view of UTB, planar transistor and a multiple gate transistor formed in accordance with an embodiment of the process invention.

FIG. 4 is a plan view of the devices illustrated in FIG. 3, but with an n-FinFET 320 and a p-UTBSOIFET 330 laid out according to a preferred embodiment. In FIG. 4, both devices are on a {110} SOI, non-hybrid substrate. The Fin is aligned along a <110> direction, i.e., the source 327 to drain 328 direction is <110>, and the Fin's sidewall surface orientation is {100}. Given this layout, the Fin's two sidewalls form a {100} Schottky S/D silicide, which is in accordance with preferred embodiments (see NMOSFET 253, FIG. 2). Likewise, the p-UTBSOIFET 330 lies on a {110} substrate with a <111> channel direction. In light of the discussion above, in an embodiment wherein layout flexibility is not a primary factor, the p-UTBSOIFET channel direction is <110>, which is the direction of maximum hole mobility.

Figure 5:
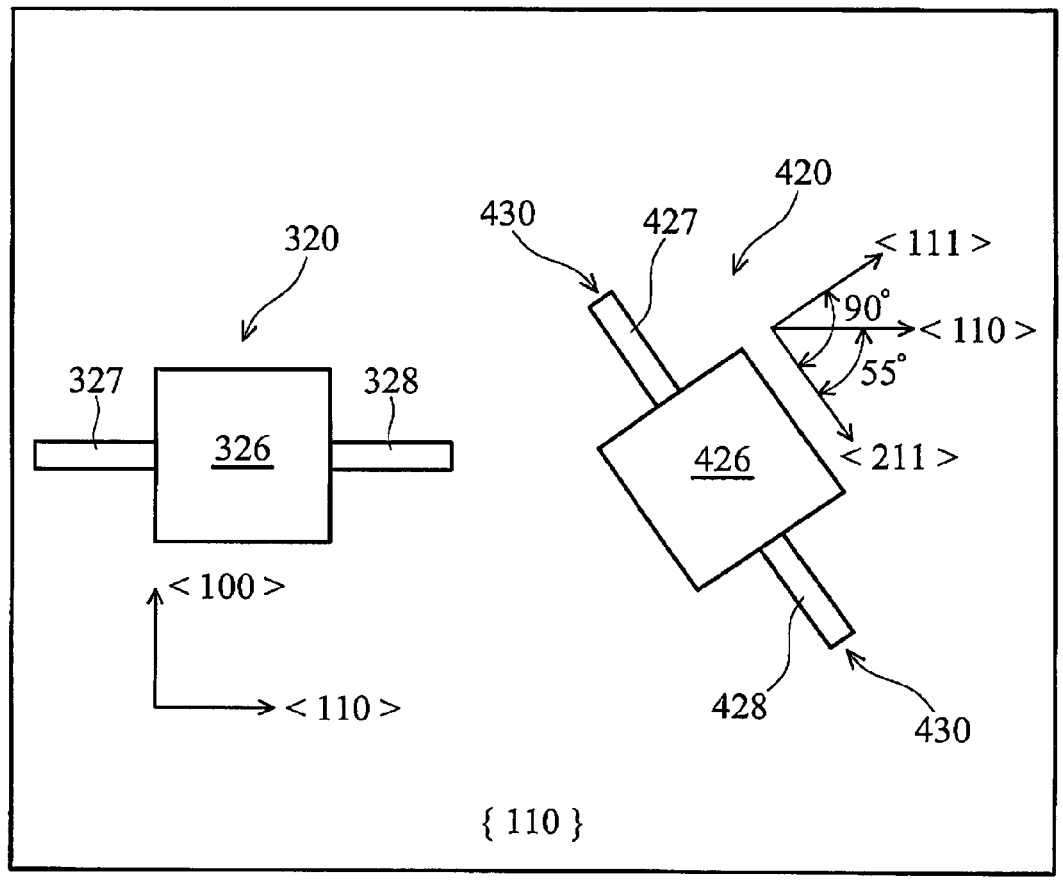
FIG. 5 is a plan view of two multiple gate transistors formed in accordance with an embodiment of the process invention.

FIG. 5 is a plan view of n-FinFET 320 and a p-FinFET 420 laid out according to a preferred embodiment. As in FIG. 4, both devices are on a {110} SOI, non-hybrid substrate, and n-FinFET Fin is aligned along a <110> direction, i.e., the source 327 to drain 328 direction is <110>, and the Fin's sidewall surface orientation is {100}. The p-FinFET 420 in this embodiment is rotated about 55° with respect to the n-FinFET 320. Therefore, the p-FinFET 420 Fin is aligned along a <211> direction, i.e., the source 427 to drain 428 direction is <211>, and the Fin's sidewall surface orientation is {111}. Furthermore, the ends 430 of p-FinFET 420 Fins necessarily form a {211} Schottky S/D interface. Recalling the discussion above, the {211} interface has a lower Schottky barrier than the {111} interface. Therefore, this embodiment improves device performance due to the superior Schottky S/D configuration.

Figure 6:
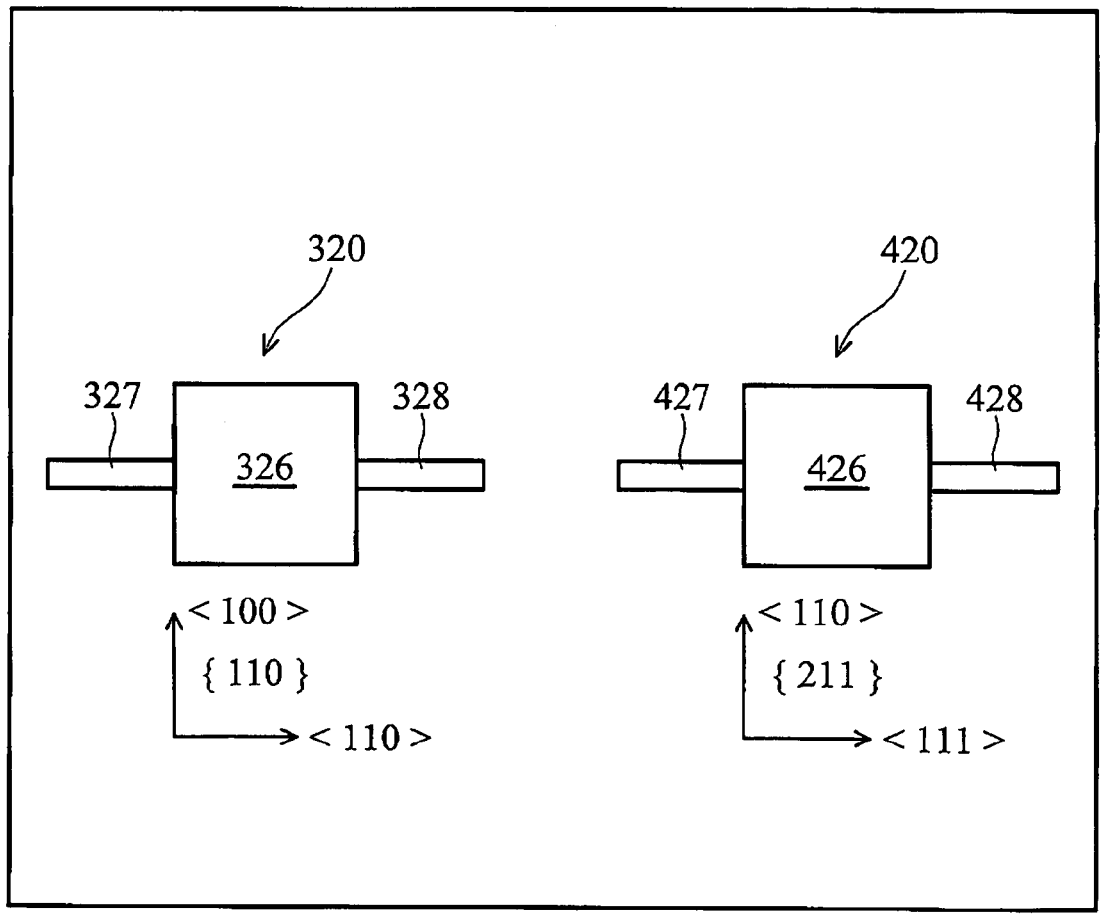
FIG. 6 is a plan view of two multiple gate transistors formed in accordance with a Schottky S/D CMOS hybrid substrate embodiment of the process invention.

One reason the embodiments illustrated in FIGS. 4 and 5 are less preferred is because they do not make the most efficient use of valuable chip real estate. Therefore, in a more preferred embodiment, which is illustrated in FIG. 6, the devices of FIG. 5 are formed on a hybrid SOI substrate with {211} and {110} orientations for p-FinFET 420 and n-FinFET 320, respectively. In this configuration, the Schottky S/D barrier is reduced with the metal silicide sidewall facing {100} for n-FinFET 320 and {110} for p-FinFET 420.

Although the present invention and its advantages have been described in detail, it will be readily understood by those skilled in the art that crystallographic orientations and directions may be varied while remaining within the scope of the present invention. For example, many of the features and functions regarding CMOS fabrication discussed above may be combined with other mobility enhancing methods.

In discussing embodiments of the invention, numerous reference is made to Schottky junctions, contacts, or diodes. While ideal Schottky junctions are abrupt, the present invention specifically anticipates that an interfacial layer may be interposed between the silicon substrate and the Schottky barrier metal. One skilled in the art realizes that such a Schottky junction may be referred to as Schottky-like. Thus, the present invention specifically anticipates Schottky-like junctions and their equivalents to be useful in implementing the present invention. Furthermore, the interfacial layer may comprise materials that have conductive, semi-conductive, and/or insulator-like properties. In preferred embodiments, the interfacial layer comprises a silicide.

Although the present invention and its advantages have been described in detail, it should be understood that various changes, substitutions and alterations may be made herein without departing from the spirit and scope of the invention as defined by the appended claims. For example, many of the features and functions discussed above may be implemented with other semiconductor technology. Examples of other technologies combinable with embodiments include additional devices such as guard rings, scrap lines, seal rings, metal pads, bipolar transistors, or diodes on substrates of single orientation.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a substrate having a first region and a second region, the first region having a first crystal orientation represented by a family of Miller indices comprising {i,j,k}, the second region having a second crystal orientation represented a family of Miller indices comprising {l,m,n}, wherein $l^2+m^2+n^2>i^2+j^2+k^2$;
an NMOSFET formed on the first region, the NMOSFET comprising a first active region with a first thickness;
a PMOSFET formed on the second region, the PMOSFET comprising a second active region with a second thickness different from the first thickness, wherein the substrate comprises a continuous semiconductor material extending between the first active region and the second active region; and
a Schottky-like contact formed within the substrate;
wherein a first one of the NMOSFET or the PMOSFET comprises a multiple gate transistor and a second one of the NMOSFET or the PMOSFET comprises a planar transistor.

2. The semiconductor device of claim 1, wherein the first crystal orientation comprises a crystal orientation consisting of {100} and {110}.

3. The semiconductor device of claim 1, wherein $l^2+m^2+n^2 \geq 2$.

4. The semiconductor device of claim 1, wherein the Schottky-like contact comprises a MOSFET source/drain.

5. The semiconductor device of claim 1, wherein the Schottky-like contact comprises a material selected from the group consisting essentially of a refractory metal, a refractory metal silicide, an n-type dopant, a p-type dopant, and combinations thereof.

6. The semiconductor device of claim 1, wherein the Schottky-like contact comprises a material selected from the group consisting essentially of Mo, Ru, Ti, Ta, W, Hf, Er, Co, Ni, Pt, silicides thereof, and combinations thereof.

7. The semiconductor device of claim 1, wherein the Schottky-like contact is less than about 500 Angstroms thick.

8. The semiconductor device of claim 1, wherein the substrate comprises a buried dielectric layer, wherein the buried dielectric layer is between about 10 to 200 nm thick.

9. A CMOS device comprising:
a dielectric layer;
a substrate on the dielectric layer, the substrate having a first region and a second region, the first region having a first crystal orientation, the second region having a second crystal orientation, wherein the first crystal orientation is different from the second crystal orientation, wherein at least one of the first region or the second region extends through the dielectric layer;
an NMOSFET formed on the first region, the NMOSFET comprising a first active region with a first thickness, an NMOS source, and an NMOS drain, wherein at least one of the NMOS source and the NMOS drain comprises a Schottky-like contact; and
a PMOSEET formed on the second region, the PMOSFET comprising a second active region with a second thickness different from the first thickness, a PMOS source, and a PMOS drain, wherein at least one of the PMOS source and the PMOS drain comprises a Schottky-like contact.

10. The semiconductor device of claim 9, wherein the first crystal orientation comprises a crystal orientation consisting of {100} and {110}.

11. The semiconductor device of claim 9, wherein the first crystal orientation is represented by a family of Miller indices comprising {i,j,k}, and wherein the second crystal orientation is represented a family of Miller indices comprising {l,m,n}, and wherein $l^2+m^2+n^2>i^2+j^2+k^2$.

12. The semiconductor device of claim 11, wherein $l^2+m^2+n^2 \geq 2$.

13. The semiconductor device of claim 9, wherein the Schottky-like contact comprises a material selected from the group consisting essentially of a refractory metal, a refractory metal suicide, an n-type dopant, a p-type dopant, and combinations thereof.

14. The semiconductor device of claim 9 wherein the Schottky-like contact is less than about 500 Angstroms thick.

15. The semiconductor device of claim 9, wherein the dielectric layer is between about 10 to 200 nm thick.

16. A semiconductor device comprising:
an insulating layer;
a substrate over the insulating layer, the substrate comprising a first portion that extends through the insulating layer;
a PMOS source on the substrate;
a PMOS drain on the substrate;
wherein at least one of the PMOS source and the PMOS drain comprises a Schottky contact, and wherein the PMOS source and the PMOS drain define a first channel there between, the first channel having a first direction of current flow and wherein an orientation of the first channel is represented by a family of Miller indices comprising <i,j,k> wherein $i^2+j^2+k^2 \geq 1$; and
a second channel on the substrate, the second channel having a second direction of current flow that is not parallel to the first direction of current flow, wherein at least one of the first channel or the second channel is located over the first portion of the substrate.

17. The semiconductor device of claim 16, wherein the Schottky contact comprises a material selected from the group consisting essentially of a refractory metal, a refractory metal silicide, an n-type dopant, a p-type dopant, and combinations thereof.

18. The semiconductor device of claim 16, wherein the Schottky contact comprises a material having a work function greater than about 4 eV.

19. The semiconductor device of claim 16, wherein the Schottky contact is less than about 500 Angstroms thick.

20. The semiconductor device of claim 16, wherein the channel orientation of the first channel comprises an orientation selected from the group consisting essentially of <110>, <111>, <211>, and <311>.

* * * * *

UNITED STATES PATENT AND TRADEMARK OFFICE
CERTIFICATE OF CORRECTION

PATENT NO. : 7,737,532 B2 Page 1 of 1
APPLICATION NO. : 11/220176
DATED : June 15, 2010
INVENTOR(S) : Ke et al.

It is certified that error appears in the above-identified patent and that said Letters Patent is hereby corrected as shown below:

In Col. 10, line 23, claim 13, delete "suicide" and insert --silicide--.

Signed and Sealed this

Sixteenth Day of November, 2010

David J. Kappos
*Director of the United States Patent and Trademark Office*